(12) United States Patent
Beck

(10) Patent No.: US 11,140,350 B2
(45) Date of Patent: Oct. 5, 2021

(54) IMAGING SYSTEM WITH SHOT-NOISE-MATCHED AND FLOATING-POINT RAMP ANALOG-TO-DIGITAL CONVERTERS

(71) Applicant: SEMICONDUCTOR COMPONENTS INDUSTRIES, LLC, Phoenix, AZ (US)

(72) Inventor: Jeffery Beck, Philomath, OR (US)

(73) Assignee: SEMICONDUCTOR COMPONENTS INDUSTRIES, LLC, Phoenix, AZ (US)

(*) Notice: Subject to any disclaimer, the term of this patent is extended or adjusted under 35 U.S.C. 154(b) by 83 days.

(21) Appl. No.: 16/667,338

(22) Filed: Oct. 29, 2019

(65) Prior Publication Data

US 2021/0058579 A1 Feb. 25, 2021

Related U.S. Application Data

(60) Provisional application No. 62/890,986, filed on Aug. 23, 2019.

(51) Int. Cl.
*H04N 5/335* (2011.01)
*H04N 5/378* (2011.01)
(Continued)

(52) U.S. Cl.
CPC .......... *H04N 5/378* (2013.01); *H03M 1/1245* (2013.01); *H03M 1/14* (2013.01); *H03M 1/46* (2013.01); *H03M 1/56* (2013.01)

(58) Field of Classification Search
CPC .......... H04N 5/378; H03M 1/56; H03M 1/46; H03M 1/124; H03M 1/1245; H03M 1/14; H03M 1/34
See application file for complete search history.

(56) References Cited

U.S. PATENT DOCUMENTS 9,445,028 B2 * 9/2016 Bock ...................... H04N 5/378
9,960,783 B2 * 5/2018 Yeh ........................ H04N 5/378
(Continued)

FOREIGN PATENT DOCUMENTS

CN     10738841       6/2010
CN     207099209      3/2018
EP     1179890 A2     2/2002

*Primary Examiner* — Kelly L Jerabek
(74) *Attorney, Agent, or Firm* — Treyz Law Group, P.C.; Jason Tsai

(57) ABSTRACT

An image sensor may include an array of image sensor pixels that are read out using analog-to-digital converters (ADCs). The ADC may be shot-noise-matched to reduce the number of decision cycles required. A ramp with limited resolution spanning only a small portion of the full scale voltage range may be used. For small analog input voltages, this limited ramp range is sufficient. For large analog input voltages, less resolution is needed due to the increasing shot noise in the photo signal. The larger input voltages may be successively divided by a selected attenuation factor until the analog input signal is within the range of the reduced ramp. The ADC keeps track of the number of divisions being performed to determine an exponent value for a floating-point output value and then convert the residual signal with the smaller ramp to determine a mantissa value for the floating-point output value.

19 Claims, 10 Drawing Sheets

(51) Int. Cl.
    *H03M 1/56*     (2006.01)
    *H03M 1/46*     (2006.01)
    *H03M 1/12*     (2006.01)
    *H03M 1/14*     (2006.01)

(56) References Cited

U.S. PATENT DOCUMENTS

| | | |
|---|---|---|
| 2006/0028368 A1 | 2/2006 | Takayanagi |
| 2009/0212987 A1 | 8/2009 | Krymski |
| 2012/0287316 A1 | 11/2012 | Kim |
| 2013/0258131 A1* | 10/2013 | Hashimoto ......... H03M 1/0609 348/222.1 |

* cited by examiner

IMAGING SYSTEM WITH SHOT-NOISE-MATCHED AND FLOATING-POINT RAMP ANALOG-TO-DIGITAL CONVERTERS

CROSS-REFERENCE TO RELATED APPLICATIONS

This application claims the benefit of U.S. Provisional Patent Application No. 62/890,986, filed on Aug. 23, 2019, the entire contents of which is incorporated herein by reference.

BACKGROUND

This relates generally to imaging devices, and more particularly, to image sensors with data converters.

Image sensors are commonly used in electronic devices such as cellular telephones, cameras, and computers to capture images. In a typical arrangement, an electronic device is provided with an array of image pixels arranged in pixel rows and pixel columns. Each image pixel in the array includes a photodiode that is coupled to a floating diffusion region via a transfer gate. Row control circuitry is coupled to each pixel row for resetting, initiating charge transfer, or selectively activating a particular row of pixels for readout. Column circuitry is coupled to each pixel column for reading out pixel signals from the image pixels.

The column circuitry typically includes analog-to-digital converters (ADCs) for converting analog readout signals into their digital equivalent. A conventional ramp ADC takes a relatively long time for conversion. For instance, a 12-bit single slope ramp ADC would require 4096 ramp steps. This limitation is further exacerbated in high dynamic range (HDR) imaging systems that require an increased number of signal conversions. Thus, a high resolution HDR imaging system implemented using traditional ramp ADCs would be either too slow or would consume too much power.

It is within this context that the embodiments described herein arise.

DETAILED DESCRIPTION

Embodiments of the present invention relate to image sensors. It will be recognized by one skilled in the art that the present exemplary embodiments may be practiced without some or all of these specific details. In other instances, well-known operations have not been described in detail in order not to unnecessarily obscure the present embodiments.

Electronic devices such as digital cameras, computers, cellular telephones, and other electronic devices may include image sensors that gather incoming light to capture an image. The image sensors may include arrays of pixels. The pixels in the image sensors may include photosensitive elements such as photodiodes that convert the incoming light into image signals. Image sensors may have any number of pixels (e.g., hundreds or thousands or more). A typical image sensor may, for example, have hundreds or thousands or millions of pixels (e.g., megapixels). Image sensors may include control circuitry such as circuitry for operating the pixels and readout circuitry for reading out image signals corresponding to the electric charge generated by the photosensitive elements.

Figure 1:
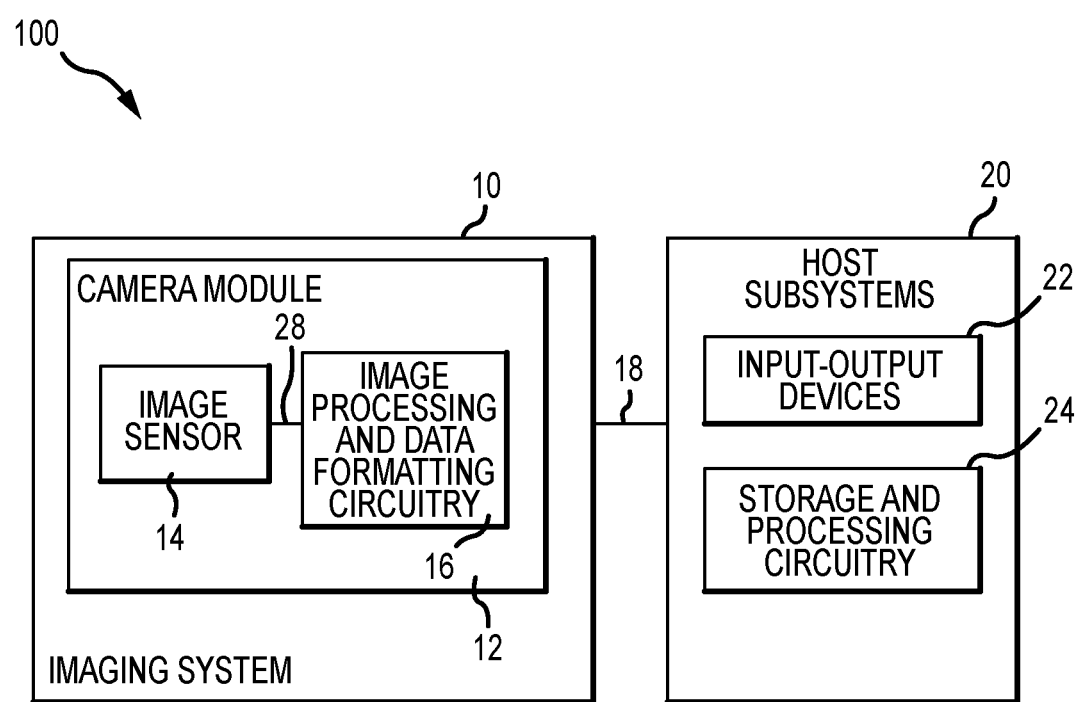
FIG. 1 is a diagram of an illustrative electronic device having an image sensor in accordance with an embodiment.

FIG. 1 is a diagram of an illustrative imaging and response system including an imaging system that uses an image sensor to capture images. System 100 of FIG. 1 may be an electronic device such as a camera, a cellular telephone, a video camera, or other electronic device that captures digital image data, may be a vehicle safety system (e.g., an active braking system or other vehicle safety system), or may be a surveillance system.

As shown in FIG. 1, system 100 may include an imaging system such as imaging system 10 and host subsystems such as host subsystem 20. Imaging system 10 may include camera module 12. Camera module 12 may include one or more image sensors 14 and one or more lenses.

Each image sensor in camera module 12 may be identical or there may be different types of image sensors in a given image sensor array integrated circuit. During image capture operations, each lens may focus light onto an associated image sensor 14. Image sensor 14 may include photosensitive elements (i.e., image sensor pixels) that convert the light into digital data. Image sensors may have any number of pixels (e.g., hundreds, thousands, millions, or more). A typical image sensor may, for example, have millions of pixels (e.g., megapixels). As examples, image sensor 14 may further include bias circuitry (e.g., source follower load circuits), sample and hold circuitry, correlated double sampling (CDS) circuitry, amplifier circuitry, analog-to-digital converter circuitry, data output circuitry, memory (e.g., buffer circuitry), address circuitry, etc.

Still and video image data from camera sensor 14 may be provided to image processing and data formatting circuitry 16 via path 28. Image processing and data formatting circuitry 16 may be used to perform image processing functions such as data formatting, adjusting white balance and exposure, implementing video image stabilization, face detection, etc. Image processing and data formatting circuitry 16 may also be used to compress raw camera image files if desired (e.g., to Joint Photographic Experts Group or JPEG format). In a typical arrangement, which is sometimes referred to as a system on chip (SoC) arrangement, camera sensor 14 and image processing and data formatting circuitry 16 are implemented on a common semiconductor substrate (e.g., a common silicon image sensor integrated circuit die). If desired, camera sensor 14 and image processing circuitry 16 may be formed on separate semiconductor substrates. For example, camera sensor 14 and image processing circuitry 16 may be formed on separate substrates that have been stacked.

Imaging system 10 (e.g., image processing and data formatting circuitry 16) may convey acquired image data to host subsystem 20 over path 18. Host subsystem 20 may include processing software for detecting objects in images, detecting motion of objects between image frames, determining distances to objects in images, filtering or otherwise processing images provided by imaging system 10.

If desired, system 100 may provide a user with numerous high-level functions. In a computer or advanced cellular telephone, for example, a user may be provided with the ability to run user applications. To implement these functions, host subsystem 20 of system 100 may have input-output devices 22 such as keypads, input-output ports, joysticks, and displays and storage and processing circuitry 24. Storage and processing circuitry 24 may include volatile and nonvolatile memory (e.g., random-access memory, flash memory, hard drives, solid-state drives, etc.). Storage and processing circuitry 24 may also include microprocessors, microcontrollers, digital signal processors, application specific integrated circuits, etc.

Figure 2:
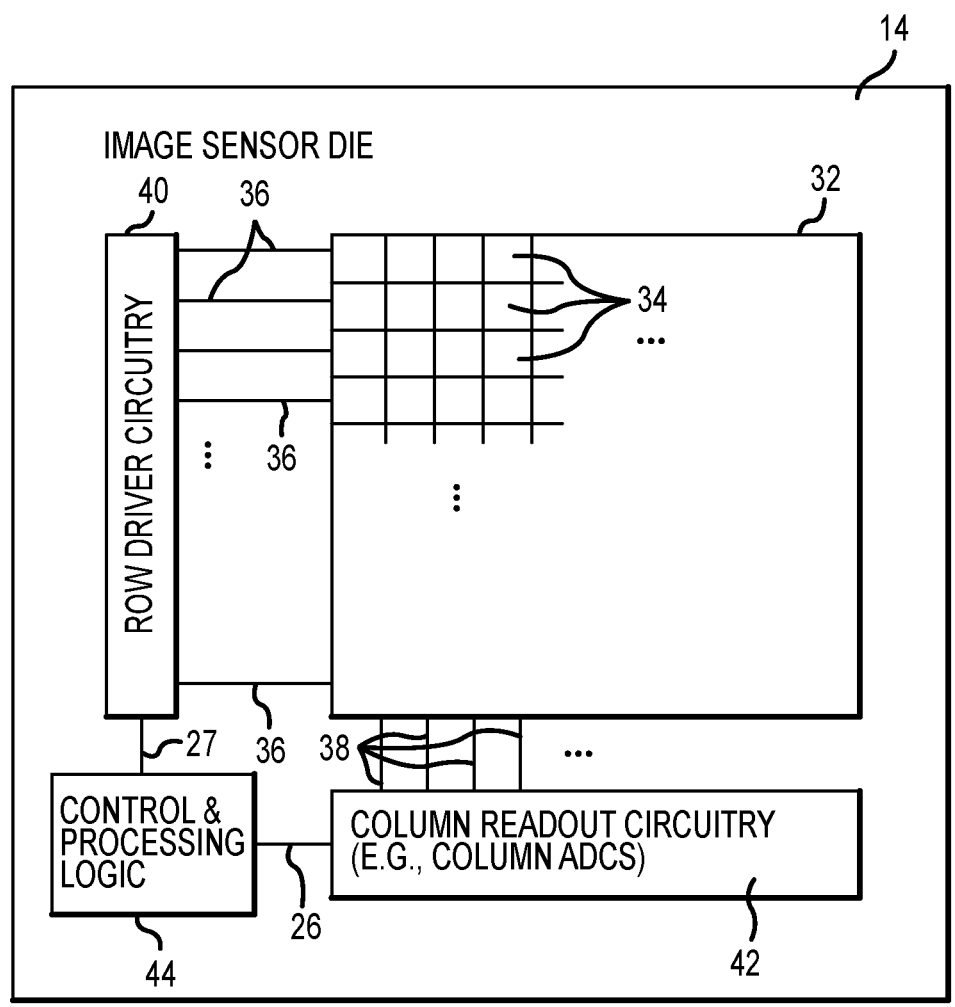
FIG. 2 is a diagram of an illustrative pixel array and associated row and column control circuitry for reading out image signals from an image sensor in accordance with an embodiment.

An example of an arrangement of image sensor 14 of FIG. 1 is shown in FIG. 2. As shown in FIG. 2, image sensor 14 may include control and processing circuitry 44. Control and processing circuitry 44 (sometimes referred to as control and processing logic) may sometimes be considered part of image processing and data formatting circuitry 16 in FIG. 1. Image sensor 14 may include a pixel array such as array 32 of pixels 34 (sometimes referred to herein as image sensor pixels, imaging pixels, or image pixels). Control and processing circuitry 44 may be coupled to row control circuitry 40 via control path 27 and may be coupled to column control and readout circuits 42 via data path 26.

Row control circuitry 40 may receive row addresses from control and processing circuitry 44 and may supply corresponding row control signals to image pixels 34 over control paths 36 (e.g., pixel reset control signals, charge transfer control signals, blooming control signals, row select control signals, dual conversion gain control signals, or any other desired pixel control signals).

Column control and readout circuitry 42 may be coupled to the columns of pixel array 32 via one or more conductive lines such as column lines 38. Column lines 38 may be coupled to each column of image pixels 34 in image pixel array 32 (e.g., each column of pixels may be coupled to a corresponding column line 38). Column lines 38 may be used for reading out image signals from image pixels 34 and for supplying bias signals (e.g., bias currents or bias voltages) to image pixels 34. During image pixel readout operations, a pixel row in image pixel array 32 may be selected using row driver circuitry 40 and image data associated with image pixels 34 of that pixel row may be read out by column readout circuitry 42 on column lines 38. Column readout circuitry 42 may include column circuitry such as column amplifiers for amplifying signals read out from array 32, sample and hold circuitry for sampling and storing signals read out from array 32, analog-to-digital converter circuits for converting read out analog signals to corresponding digital signals, and column memory for storing the read out signals and any other desired data. Column control and readout circuitry 42 may output digital pixel readout values to control and processing logic 44 over line 26.

Array 32 may have any number of rows and columns. In general, the size of array 32 and the number of rows and columns in array 32 will depend on the particular implementation of image sensor 14. While rows and columns are generally described herein as being horizontal and vertical, respectively, rows and columns may refer to any grid-like structure (e.g., features described herein as rows may be arranged vertically and features described herein as columns may be arranged horizontally).

As described in the background section, conventional single slope analog-to-digital converters (ADCs) rely on a single ramp that covers the entire full scale range of the analog signal and ramping through that entire range can be extremely time consuming and consume a lot of power. It would therefore be desirable to provide image sensors with faster and more power efficient ADCs while still meeting signal-to-noise ratio (SNR) criteria.

In accordance with an embodiment, a method of operating an ADC is provided that first attenuates the input signal until the attenuated input signal falls below a predetermine threshold level, that uses a short ramp to determine the actual voltage level of the attenuated input signal, and that computes the final ADC output based on based on the amount of attenuation applied and the ramp determination result. The amount of signal attenuation may be represented by an exponent value of an ADC floating-point output format, whereas the ramp determination result may be represented by a mantissa value of the ADC floating-point output format.

Figure 3:
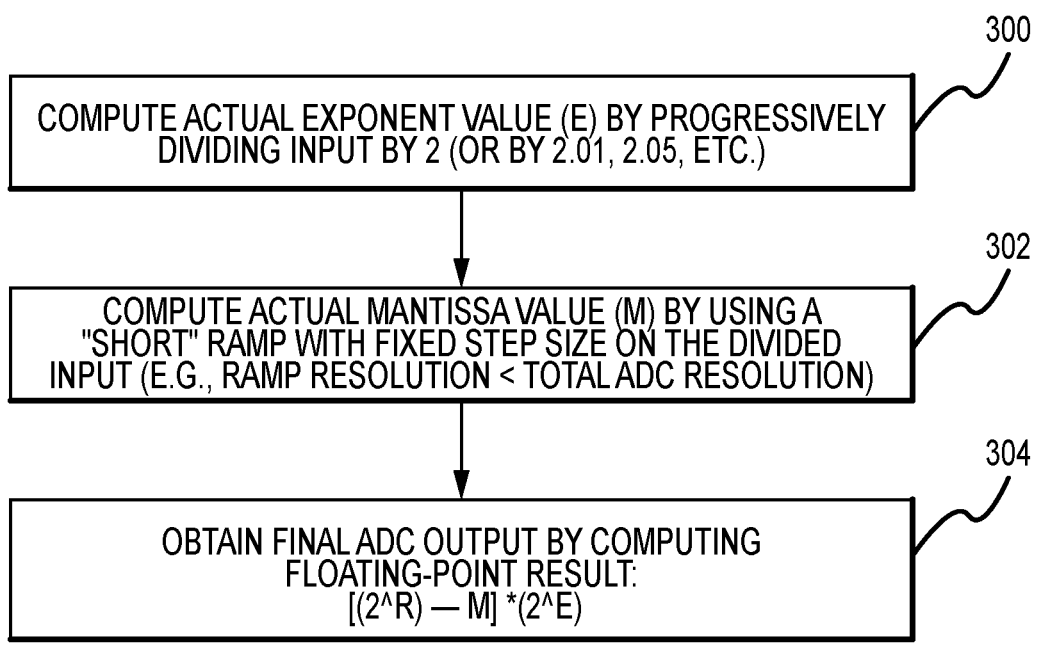
FIG. 3 is a flow chart of illustrative steps for computing an analog-to-digital converter (ADC) floating-point output in accordance with an embodiment.

FIG. 3 is a flow chart of illustrative steps for computing an ADC floating-point output. At step 300, the ADC may compute an actual exponent value (E) by progressively attenuating or dividing an input signal (i.e., the pixel output signal received at the ADC from a selected image sensor pixel) by a factor, where E represents the number of times the input has to be divided until the signal levels falls below a predetermined comparison level. Device configurations in which the ADC input signal is attenuated by a factor of 2 may sometimes be described herein as an example. This is, however, merely illustrative. If desired, the factor for division may be equal to 2.01, 2.05, 2.1, 1 to 2, 2 to 3, any suitable number greater than 2, any suitable number greater than 1, etc. This factor may be selected or adjusted to control the speed at which the input attenuation occurs. In general, signal attenuation via division can occur much more quickly than ramping. The exponent value E may be memorized using an exponent counter (as an example).

At step 302, the ADC may compute an actual mantissa value (M) by using a "short" ramp with a fixed step size on the divided/attenuated input generated at the end of step 300. The term "short" used herein may refer to a reduced ramp resolution that is less than the total resolution of the ADC. In other words, the ramp coverage may be smaller than the full scale range of the ADC input signal. As examples, the ramp coverage may be only ½ of the full scale range, only ¼ of the full scale range, only ⅛ of the full scale range, only 1/16 of the full scale range, only 1/32 of the full scale range, or any suitable fraction of the full scale range.

The ramp coverage may define the maximum number of times the input signal can be divided. As an example, if the ramp coverage is 1/16 of the full scale range, the ADC input should only be divided by 2 at most four times. As another example, if the ramp coverage is 1/64 of the full scale range, the ADC input should only be divided by 2 at most six times. In other words, if the ramp coverage is $1/(2^F)$ of the full scale range, the maximum possible exponent value E is capped at F (i.e., E is less than or equal to F).

Moreover, the incremental step size of the ramp should remain fixed regardless of the input voltage level (i.e., the ramp step size is independent of the pixel output level). The number of ramp steps taken to reach the attenuated input level determines the actual mantissa value M. The actual mantissa value is therefore capped by the resolution of the reduced ramp (i.e., M is less than or equal to the maximum number of ramp steps). Thus, in an example where the reduced ramp resolution R is 7 bits, the mantissa value is limited to $2^7$ or 128. The mantissa value M may be memorized using a mantissa counter (as an example). In general, ramp resolution R is independent of the exponent limiting factor F. The single-step increment of the reduced ramp configured in this way will be equal to full scale voltage $Vref/2^{(F+R)}$. Thus, the full resolution of this ADC is a function of both F and R.

At step 304, the post processing logic (see, e.g., logic 44 in FIG. 2) may be used to compute the final ADC output based on the floating-point figures E obtained at step 300 and M obtained at step 302. Assuming the ramp starts at a high level and digitally counts downwards towards the attenuated signal value, the final ADC output may be computed as follows:

$$ADC\_out=[(2^R)-M]*(2^E) \quad (1)$$

where R is the total resolution of the reduced ramp. Computing an ADC output in this floating-point manner is both faster and more power efficient than the conventional single-slope ramping approach.

Figure 4A:
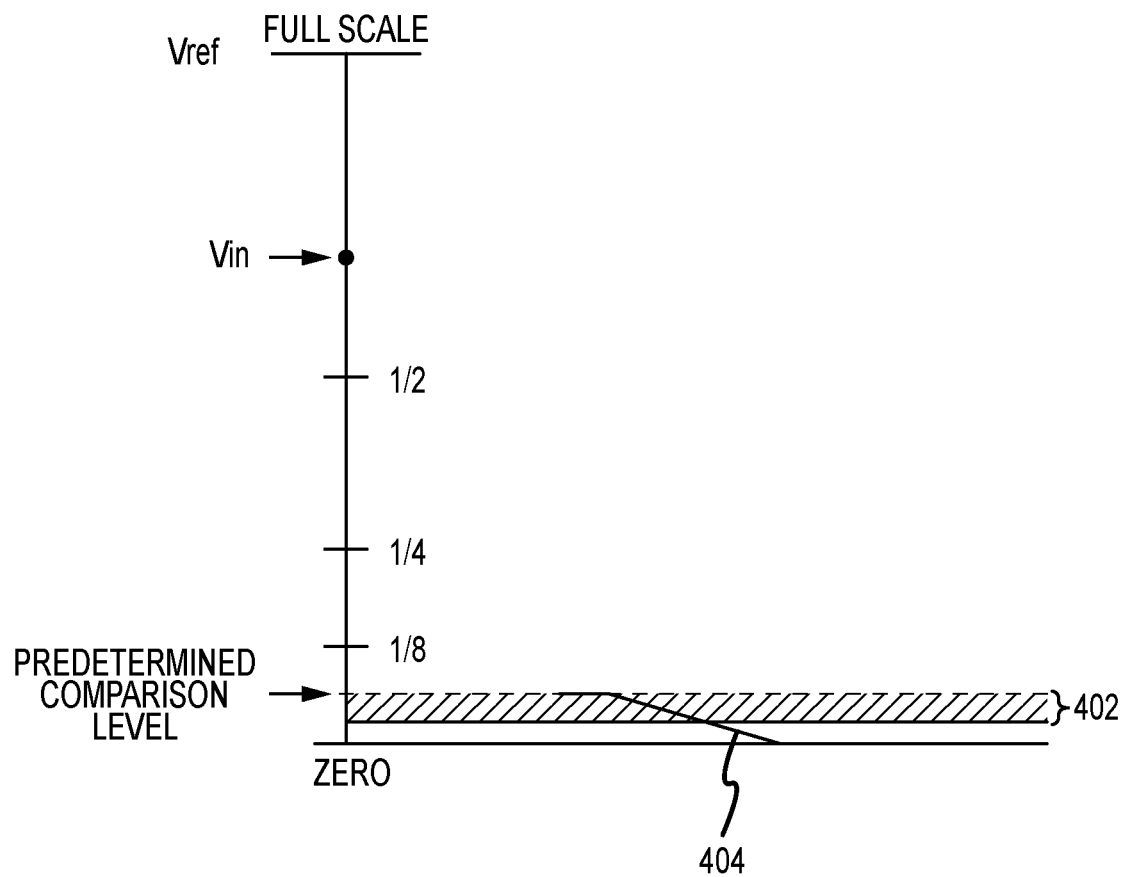
FIG. 4A is a diagram showing a reduced ramp that covers only a lower portion of the full scale range in accordance with an embodiment.

FIG. 4A is a diagram showing a reduced ramp that covers only a lower portion of the full scale range. In the example of FIG. 4A, the reduced ramp 404 spans the range zero to 1/16 of the full scale voltage Vref. Thus, the maximum possible exponent amount F is equal to 4. Note that an F value of 4 may be encoded using only three bits. The ramp will start at a predetermined comparison level that is set equal to [Vref/$(2^F)$], which is equal to Vref/16 in this case.

Any ADC input Vin that is between the predetermined comparison level and Vref will fall into upper ramp range 402 after one or more rounds of attenuation. If Vin falls in the range Vref/2 to Vref (see input signal level in FIG. 4A), then four divisions are required to bring the signal level into range 402 (i.e., E=F=4). If Vin falls in the range Vref/4 to Vref/2, then three divisions are needed to attenuate the signal level into range 402 (i.e., E=3). If Vin falls in the range Vref/8 to Vref/4, then two divisions are needed to reduce the signal level into range 402 (i.e., E=2). If Vin falls in the range Vref/16 to Vref/8, then one division is needed to decrease the signal level into range 402 (i.e., E=1). If Vin falls in the range 0 to Vref/16, no division is needed (i.e., E=0) since the input signal is already within the reduced ramp range.

Figure 4B:
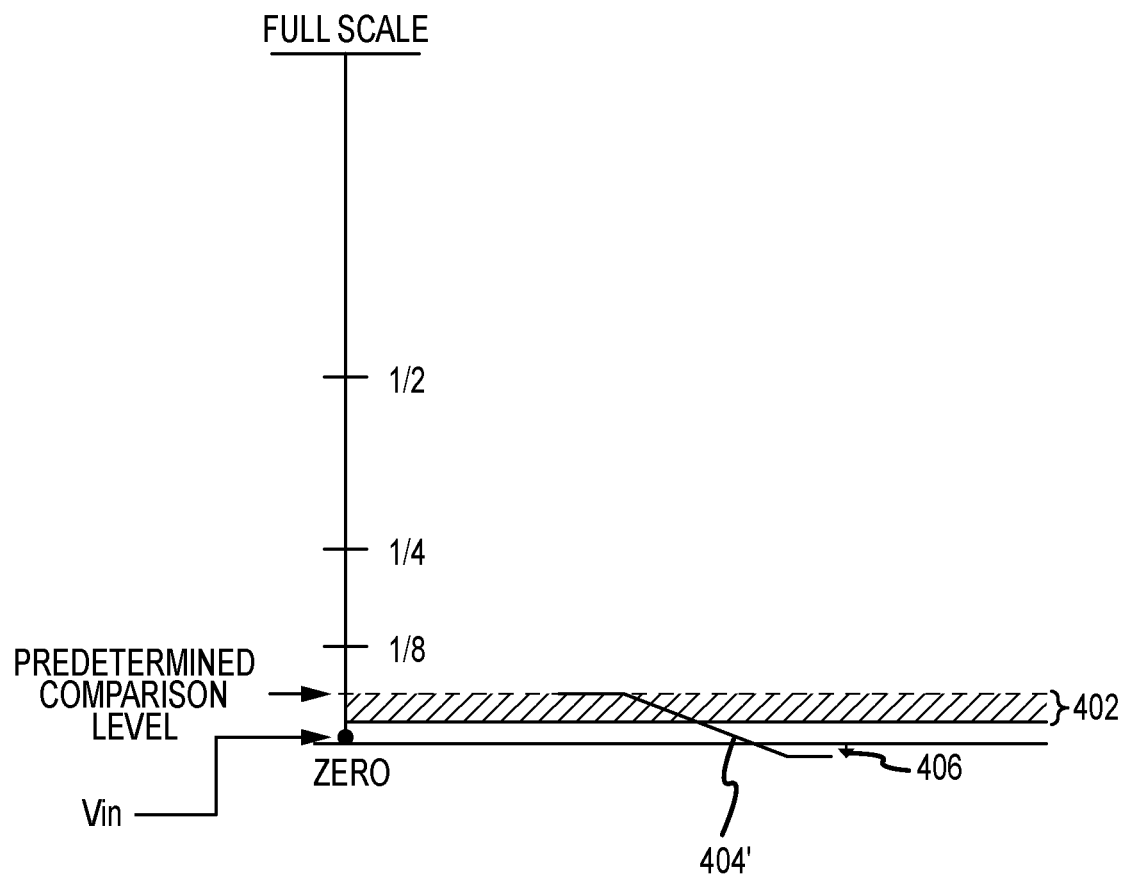
FIG. 4B is a diagram showing how the reduced ramp can be over-ranged to account for comparator offset in accordance with an embodiment.

The ramp configuration of FIG. 4A may be sufficient assuming the ADC is ideal. In practice, however, ADCs may exhibit an input offset that can potentially shift the input signal up or down. FIG. 4B is a diagram showing how the reduced ramp can be over-ranged to account for comparator offset in accordance with another embodiment. As shown in FIG. 4B, the ramp may be extended by using additional codes so that the total ramp range 404' is pushed below zero, as indicated by arrow 406. The use of additional codes for ramp 404' may allow input signals Vin sitting close to zero to still be properly resolved even when there is some amount of comparator offset.

Figure 4C:
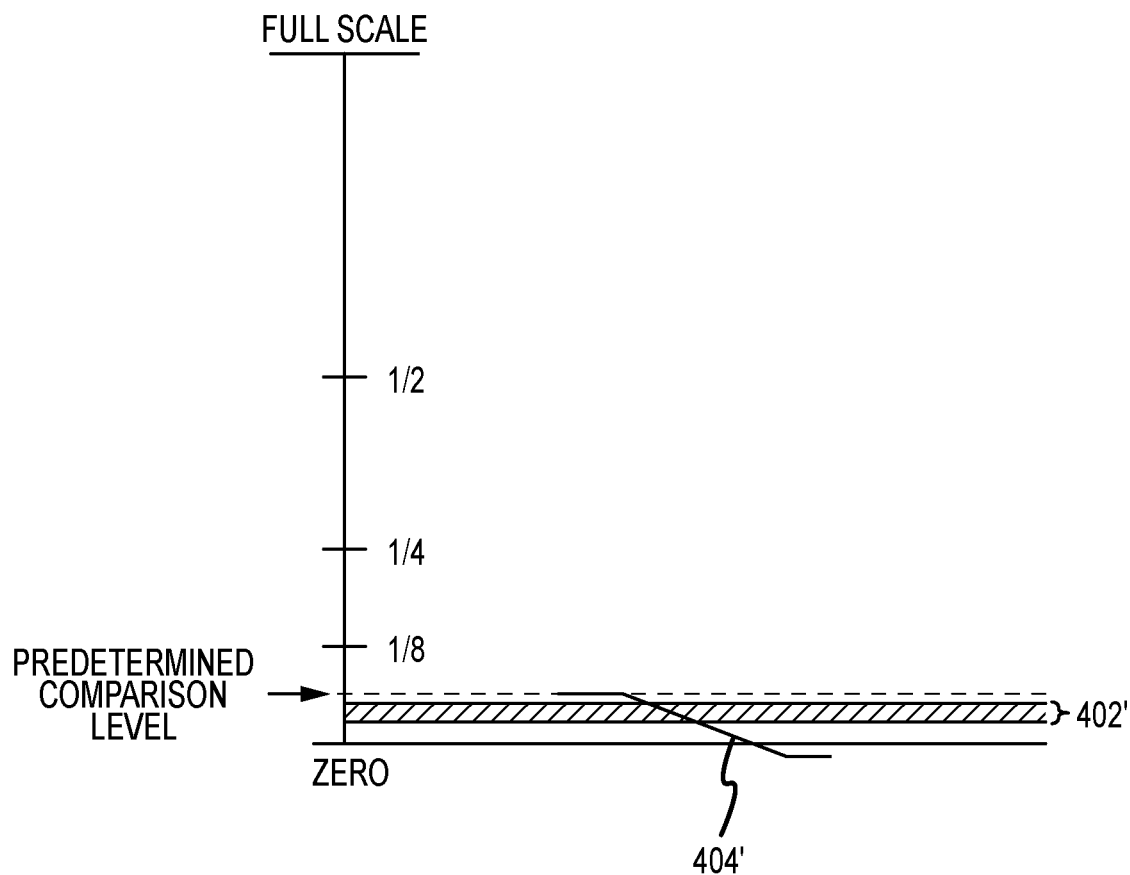
FIG. 4C is a diagram showing how additional margin can be provided by using a different division factor in accordance with an embodiment.

FIG. 4B illustrates how over-ranging at the zero level can help provide additional margin of error for very low signals. If desired, additional margin may also be provided near the start of the ramp range at the predetermined comparison level by using a slightly different division factor. In the example of FIG. 4C, an attenuation factor of 2.01 will ensure that any input Vin that is between the predetermined comparison level and Vref will fall into upper ramp range 402' after one or more rounds of attenuation. As shown in FIG. 4C, the upper limit of ramp range 402' will now sit slightly below the predetermined comparison level, thus providing more margin for signals that can potentially land near the predetermined comparison level after attenuation.

Figure 5:
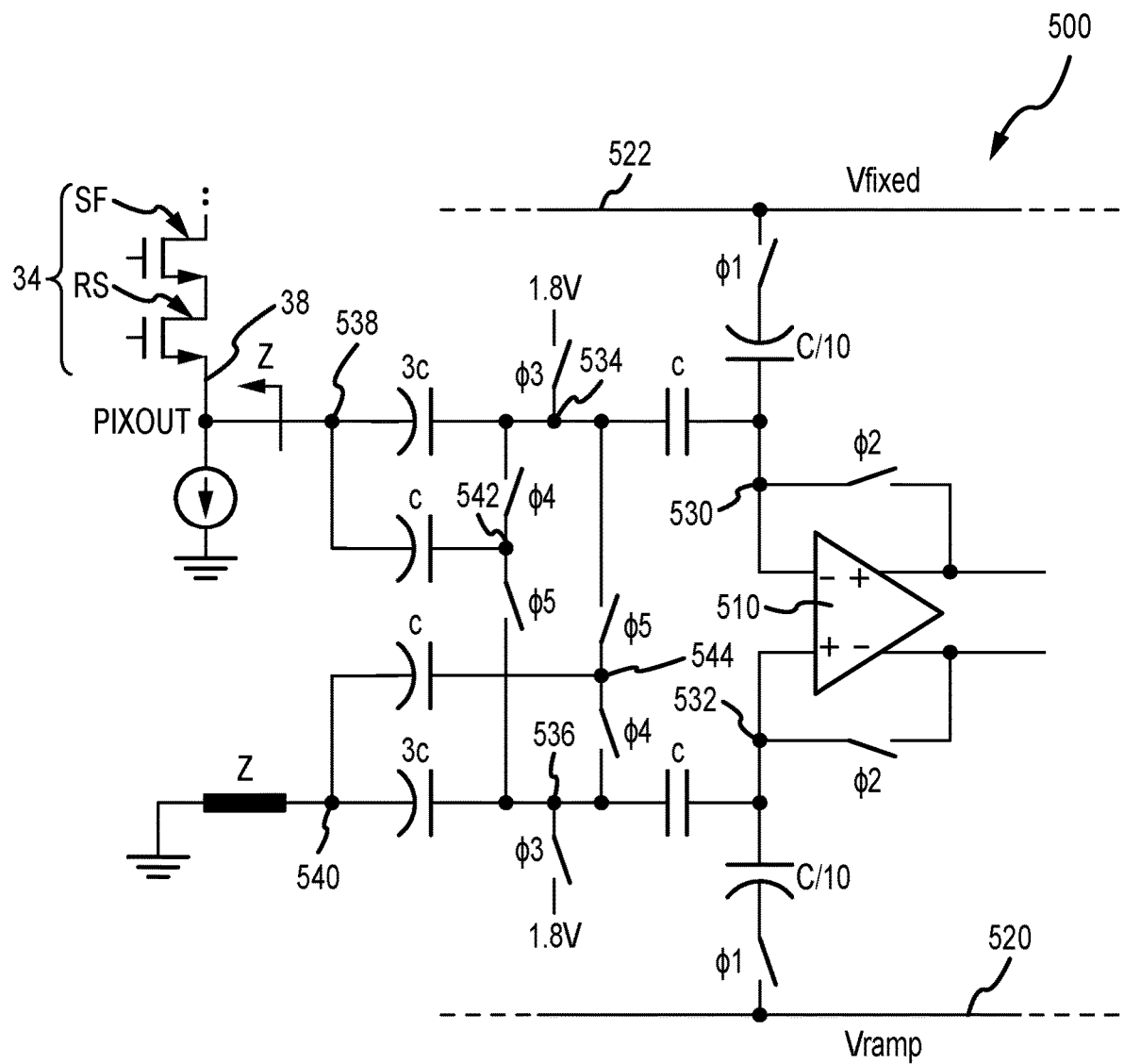
FIG. 5 is a circuit diagram of an illustrative analog-to-digital converter (ADC) circuit configured to receive signals from image sensor pixels in accordance with an embodiment.

FIG. 5 is a circuit diagram of an illustrative analog-to-digital converter (ADC) circuit 500 that can be used to support the floating-point output format described herein. As shown in FIG. 5, converter 500 may include a comparator 510 having a first (negative) input coupled to node 530, a second (positive) input coupled to node 532, a first (+) output coupled to the first (−) input via a first comparator auto-zeroing switch φ2, and a second (−) output coupled to the second (+) input via a second comparator auto-zeroing switch φ2. Node 530 may be coupled to another intermediate node 534 via a first capacitor with capacitance C, whereas node 532 may be coupled to yet another intermediate node 536 via a second capacitor also with capacitance C. Node 530 may further be coupled to a constant voltage line 522 (e.g., a voltage terminal on which fixed voltage Vfixed is provided) via a third capacitor with capacitance C/10 and a first switch φ1, whereas node 532 may be coupled to the ramp voltage line 520 (e.g., a voltage terminal on which ramp voltage Vramp is driven) via a fourth capacitor also with capacitance C/10 and a second switch φ1.

Node 534 may be coupled to a 1.8 V power supply line via a first switch φ3. Similarly, node 536 may be coupled to a 1.8 V power supply line via a second switch φ3. The 1.8 V power supply line used here is merely illustrative. In general, other positive power supply voltage levels may be used. Node 534 may be selectively coupled to node 544 via a first switch φ5, whereas node 536 may be selectively coupled to node 544 via a first switch φ4. Node 534 may be selectively coupled to node 542 via a second switch φ4, whereas node 536 may be selectively coupled to node 542 via a second switch φ5. A fifth capacitor with capacitance 3C may be coupled between node 534 and node 538, whereas a sixth capacitor also with capacitance 3C may be coupled between node 536 and node 540. A seventh capacitor with capacitance C may be coupled between node 542 and node 538, whereas an eighth capacitor also with capacitance C may be coupled between node 544 and node 540.

Node 538 may be coupled to a corresponding pixel column output line 38. Pixel column line 38 may be coupled to a column of image sensor pixels 34, one of which may be selected to output an image signal via the associated source follower transistor SF and row select transistor RS in that pixel. An impedance matching circuit with impedance Z may be connected at node 540 to match the impedance at node 538 looking into the column pixel line 38 (which should also be equal to Z).

The ADC capacitance C may be any suitable value that can provide sufficient charge storing capabilities without taking up too much area on the image sensor. The ADC architecture of FIG. 5 is merely illustrative and is not intended to limit the scope of the present embodiments. If desired, ADC 500 may be implemented in other suitable ways that can still support progressive signal attenuation and reduced signal ramping. The exemplary ADC architecture of FIG. 5 may also allow for a reduced common-mode swing compared to conventional single slope ADC implementations. There is also no sampling switch for discretely sampling the pixel output signals onto the ADC input. In other words, the pixel output line is capacitively coupled to the input of the comparator. Similarly, analog voltage Vramp is also capacitively coupled to the input of the comparator. This configuration is sometimes referred to as a "non-sampled" ramp architecture.

Figure 6:
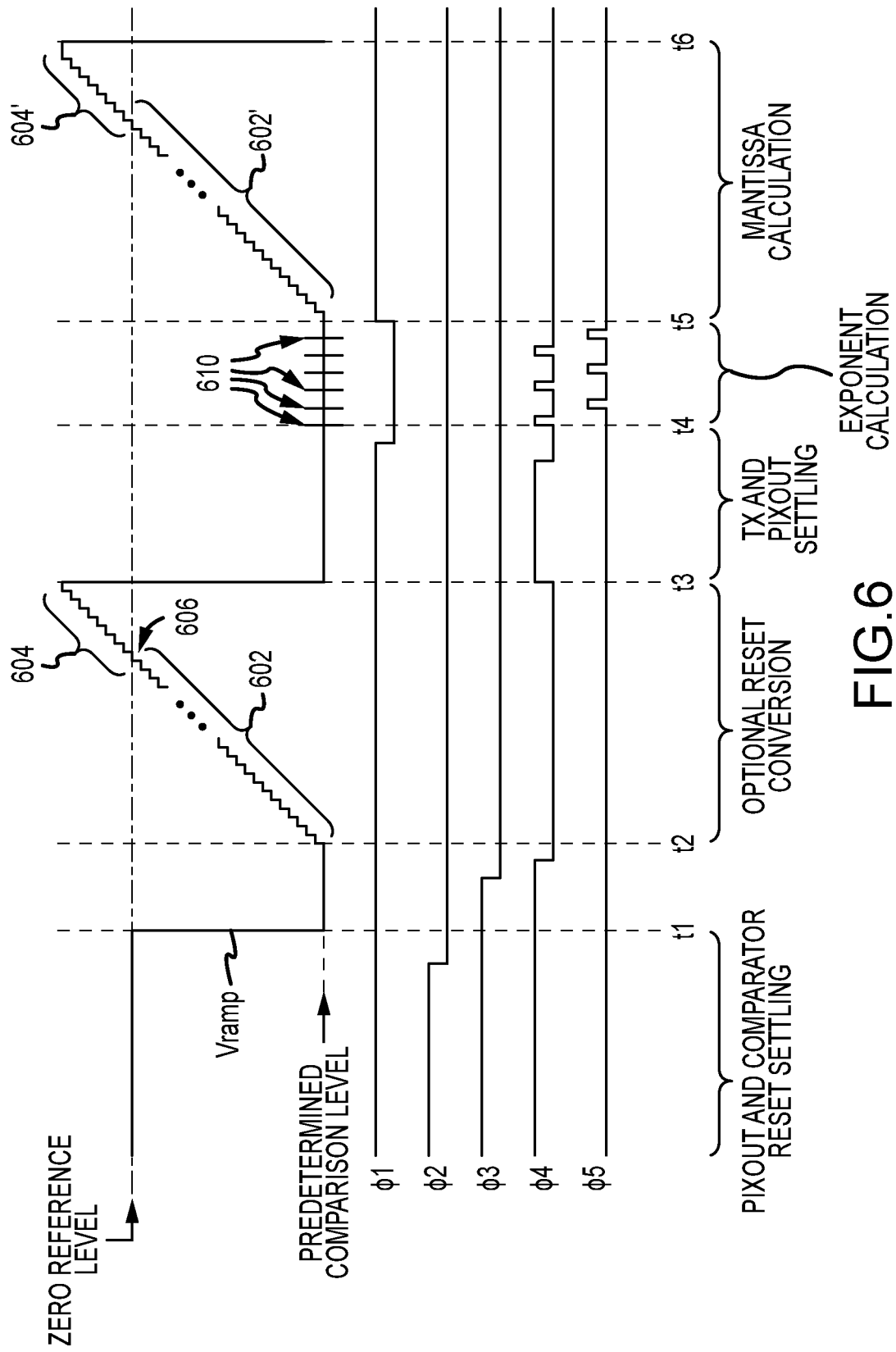
FIG. 6 is a timing diagram illustrating how the ADC circuit shown in FIG. 5 can be used to perform digital correlated double sampling (DCDS) and to calculate floating-point exponent and mantissa values in accordance with an embodiment.

FIG. 6 is a timing diagram illustrating how the ADC circuit shown in FIG. 5 can be used to perform digital correlated double sampling (DCDS) and to calculate floating-point exponent and mantissa values. Prior to time t1, ramp voltage Vramp may be held at a zero reference level of the comparator (although Vramp isn't necessarily equal to ground at this time) while switches φ1, φ2, φ3, and φ4 are turned on. Turning on switches φ1 will couple node 530 to Vfixed while also coupling node 530 to Vramp. Activating switches φ2 will reset the input-output terminals of comparator 510, whereas enabling switches φ3 and φ4 would reset the charge on the capacitors on both halves of comparator 510. Switches φ2 may then be turned off prior to time t1, thus storing any comparator offset on nodes 530 and 532 and allowing any signals on the pixel output line and the comparator reset signals to settle.

At time t1, voltage Vramp is adjusted from the zero reference level to a predetermined comparison level (sometimes referred to as a predetermined threshold voltage level). Thereafter, switches φ3 and φ4 may be turned off. At this point, only switches φ1 may remain in the on state.

From time t2 to t3, the ADC may optionally perform reset conversion by incrementally stepping up Vramp towards the zero reference level, as illustrated by portion 602. Although analog voltage Vramp is being increased, the ADC may actually be digitally counting downwards in practice. Assuming the ramp has a 7 bit resolution, the analog ramp may start with a code value of 2^7 or 128 at time t2 when Vramp is at the predetermined comparison level. The code should be equal to zero where the analog ramp crosses the zero reference level, as indicated by arrow 606. Where the analog ramp extends above the zero reference level, the code may be negative (e.g., −1, −2, −3, and so on). The portion 604 where Vramp goes above the zero reference level represents the over-ranging feature 406 described in connection with FIG. 4B to provide margin to account for comparator offset when Vin is near zero.

The reset level determined during this time may be subsequently used for DCDS (i.e., by subtracting the reset level from the signal level). Since DCDS only computes the difference between the reset and signal levels, it does not matter if the reset/signal conversion generates a positive or negative value.

From time t3 to t4, charge transfer (TX) may occur at the image sensor pixels 34 while switches φ4 may be temporarily turned on to allow the image signals that are read out from the selected pixels to settle on the pixel output line 38 at the input of the ADC. Prior to time t4, switches φ1 and φ4 may be turned off. At this point, all switches in the ADC should be in the off state.

From time t4 to t5, the ADC may perform exponent calculation by toggling switches φ4 and φ5 in an alternating manner. Every time switches φ4 are pulsed while switches φ1 and φ5 are off, the ADC capacitors will be configured in a way such that the charge sharing will attenuate the input signal level by half (or using some other dividing factor). Similarly, every time switches φ5 are pulsed while switches φ1 and φ4 are deactivated, the ADC capacitors will be configured in a way such that the charge sharing will divide the previously attenuated input signal level again by two (or by some other attenuation factor). The actual attenuation factor may be adjusted by controlling the ratio of the various ADC capacitors coupled to switches φ4 and φ5 at the input of the ADC. Attenuation via charge sharing in this way is sometimes referred to as a "passive" division.

In the example of FIG. 6, the ADC may perform up to six consecutive divisions, as indicated by arrows 610 (i.e., parameter F=6). This does not mean that six divisions have to occur. The actual number of attenuations may be equal to 0, 1, 2, 3, 4, 5, or 6 depending on the starting input level (i.e., the exponent value E will be less than or equal to F). The comparator is used to determine when to stop attenuating the input signal by comparing to the predetermined threshold level and feeding this information back to logic (not shown) which controls toggling of the φ4 and φ5 switches.

From time t5 to t6, the ADC may optionally perform mantissa calculation by incrementally stepping up Vramp towards the zero reference level, as illustrated by portion 602'. Voltage Vramp may be increased until it crosses the attenuated input signal level. The number of ramp steps it takes to reach this crossing point will be equal to the mantissa output. Although analog voltage Vramp is being increased, the ADC may be digitally counting downwards in the actual implementation. The portion 604' where Vramp goes above the zero reference level represents the over-ranging feature 406 described in connection with FIG. 4B to provide margin to account for comparator offset when Vin is near zero. The actual signal level may be determined at any point along portion 602' or maybe even portion 604' when Vin is very small and if there is considerable amount of comparator offset. As shown in FIG. 6, exponent calculation can occur in a much shorter time period than mantissa calculation since dividing via charge sharing is fast.

Figure 7:
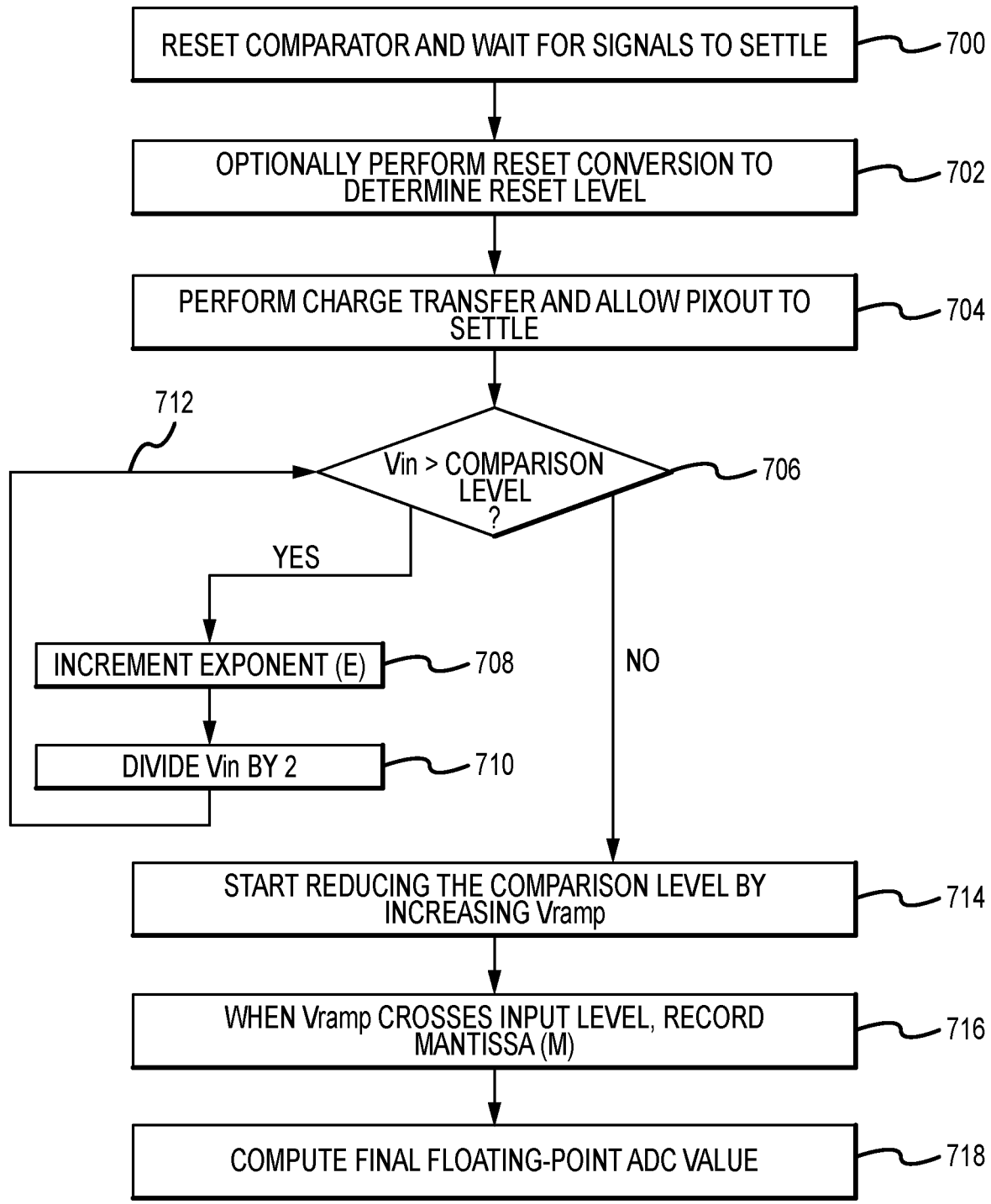
FIG. 7 is a flow chart of illustrative steps for operating the ADC circuit shown in FIG. 5 in accordance with an embodiment.

FIG. 7 is a flow chart of illustrative steps for operating ADC circuit 500 of the type shown in FIG. 5 to compute a floating-point ADC output. At step 700, the ADC comparator may be reset (or auto-zeroed) and may then wait for all signals to settle (see FIG. 6 prior to time t1). At step 702, the ADC may optionally perform reset conversion to determine the reset level (see FIG. 6 from time t2 to t3).

At step 704, the array of image pixels may perform charge transfer and allow the pixel output lines to settle (see FIG. 6 from time t3 to t4). At step 706, the ADC may determine whether the current input level Vin is greater than the predetermined comparison level (see, e.g., FIGS. 4A, 4B, 4C, and 6). In response to determining that the current input level exceeds the predetermined comparison level, an exponent counter is incremented to increase exponent value E (at step 708) and Vin will be divided by 2 or some other attenuation factor (at step 710). Processing may then loop back to step 706 to perform additional input attenuation if necessary, as indicated by path 712.

When the current signal level is no longer greater than the predetermined comparison level, the comparator comparison level may be effectively reduced by increasing analog voltage Vramp (at step 714). When Vramp cross the attenuated input level (at step 716), the ADC may record the mantissa value M. At step 718, the ADC may compute the final floating-point ADC value based on the obtained E and M values in accordance with equation (1) described in connection with FIG. 3 above.

Figure 8A:
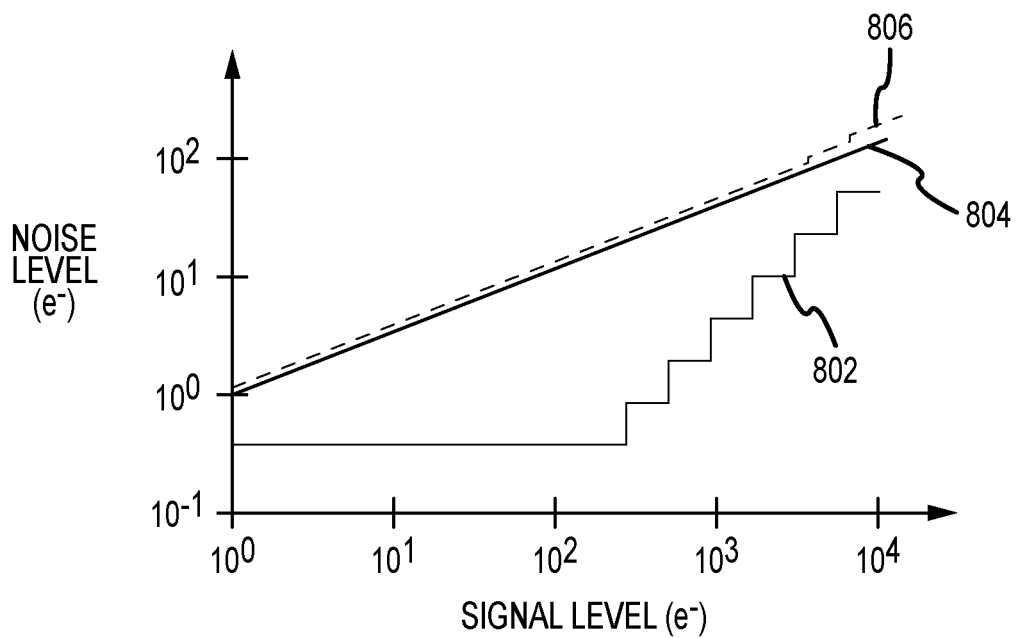
FIG. 8A is a plot illustrating how an ADC circuit operated in the way shown in FIGS. 3-7 exhibits a shot-noise-matched property when an image pixel is configured in high conversion gain mode in accordance with an embodiment.

An ADC configured and operated in the way illustrated in FIGS. 2-7 takes advantage of the shot noise property of the image sensor by allowing a higher amount of ADC quantization noise at higher light levels while still maintaining signal-to-noise ratio (SNR) performance. FIG. 8A is a plot illustrating how an ADC operated in the way shown in FIGS. 3-7 may exhibit a shot-noise-matched property when an image pixel is configured in high conversion gain mode. High conversion gain mode may be used when low light signals are being captured. As shown in FIG. 8A, the image sensor may exhibit a shot noise level 804 representing an inherent or intrinsic amount of noise that is present when collecting charge using photodiodes. The ADC may exhibit a quantization noise characteristic 802 that also ramps up with the shot noise characteristic 804. The total combined noise level of the quantization noise 802 and the shot noise 804 is illustrated by dotted line 806.

Conventional ADCs typically have quantization noise levels that remain flat throughout the entire range of the pixel signal level (i.e., the quantization noise does not ramp up with the shot noise). ADC designs with a completely flat quantization noise level, however, are slow and power hungry. In contrast, ADCs with a non-flat quantization noise level such as the one shown in FIG. 8A (sometimes referred to as a shot-noise-matched ADC design) are much faster and power efficient. The amount of shot noise matching can be controlled by adjusting the maximum number of divisions (F) and the total number of ramp steps ($2^R$). For example, increase the number of exponent steps while decreasing the total number of ramp steps will speed up the ADC dramatically but will push up the quantization noise curve. Alternative, decreasing the number of exponent steps while increasing the total number of ramp steps will slow down the ADC but will push down the quantization noise curve. Thus, the parameter F and R should be carefully adjusted to provide the desired performance and power tradeoff.

Figure 8B:
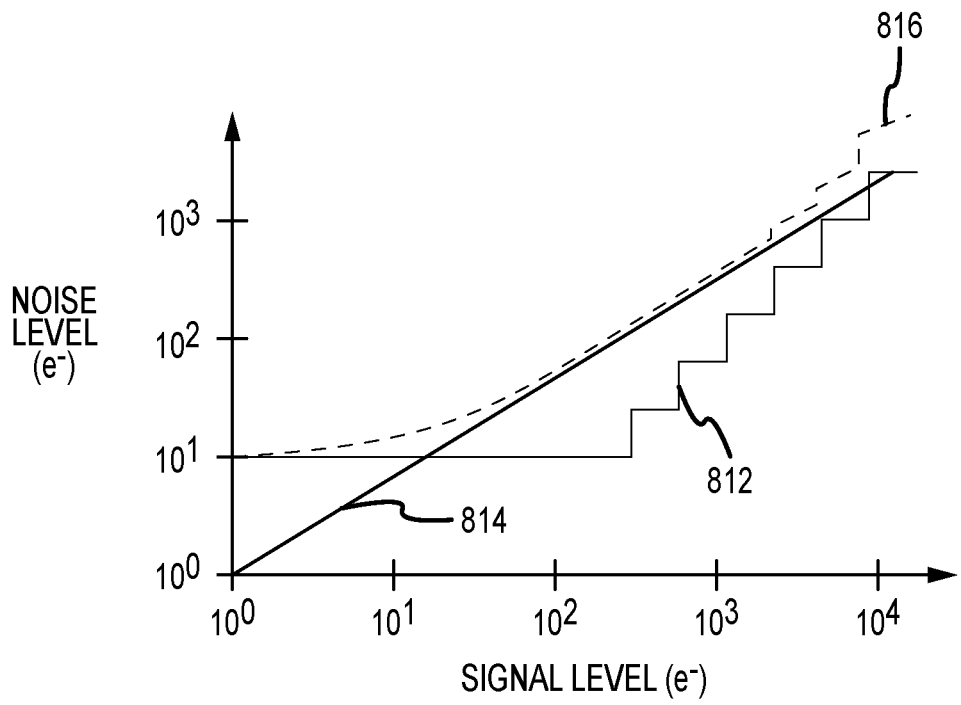
FIG. 8B is a plot illustrating how an ADC circuit operated in the way shown in FIGS. 5-6 exhibits a shot-noise-matched property when an image pixel is configured in low conversion gain mode in accordance with an embodiment.

FIG. 8B is a plot illustrating how the ADC may exhibit a shot-noise-matched property when the image pixel is configured in low conversion gain mode. Low conversion gain mode may be used when high light signals are being captured. As shown in FIG. 8B, the image sensor may exhibit a shot noise level 814 representing an inherent or intrinsic amount of noise that is present when collecting charge using photodiodes. The ADC may exhibit a shot-noise-matched quantization noise characteristic 812 that also ramps up with the shot noise characteristic 814. The total combined noise level of the quantization noise 812 and the shot noise 814 is illustrated by dotted line 816. As shown in FIG. 8B, the noise level deviates the most at high signal levels, which is acceptable since SNR is typically already sufficient at the high end. Although the quantization noise level 812 dominates the SNR at the low end, this does not matter since low conversion gain is typically not used at such signal levels.

Analog-to-digital converters implemented in this way can provide best-in-class power consumption for imaging devices and enable improved HDR imaging at fast frame rates for large pixel arrays. The non-sampled ramp architecture of FIG. 5 may also provide low random area noise, low row temporal noise (RTN), and can help suppress random telegraph signal (RTS) noise. The optional DCDS can also help ensure low column fixed-pattern noise.

The foregoing is merely illustrative of the principles of this invention and various modifications can be made by those skilled in the art without departing from the scope and spirit of the invention. The foregoing embodiments may be implemented individually or in any combination.

What is claimed is:

1. An image sensor, comprising:
an image pixel;
a pixel output line that is coupled to the image pixel, wherein the image pixel is configured to output a signal onto the pixel output line; and
an analog-to-digital converter (ADC) circuit configured to receive the signal from the image pixel via the pixel output line, to divide the signal, and to use a voltage ramp with a ramp resolution that is less than the total resolution of the ADC circuit to determine the voltage of the divided signal.

2. The image sensor of claim 1, wherein the ADC circuit is configured to divide the received signal by a factor of 2.

3. The image sensor of claim 1, wherein the ADC circuit is configured to divide the received signal by a factor that is greater than 2 to provide margin for the voltage ramp.

4. The image sensor of claim 1, wherein the ADC circuit is configured to divide the received signal by up to F times, and wherein F is an integer greater than one.

5. The image sensor of claim 4, wherein the ADC circuit is configured to divide the received signal until the signal falls below a predetermined comparison level, and wherein the number of times the ADC circuit actually divides the received signal is equal to an exponent value E, and wherein E is less than or equal to integer F.

6. The image sensor of claim 5, wherein the ADC circuit is configured to incrementally adjust the voltage ramp until the voltage ramp crosses the divided signal, and wherein the amount by which the voltage ramp is adjusted is equal to a mantissa value M.

7. The image sensor of claim 6, wherein the ADC circuit is configured to compute a floating-point output based on the exponent value E and the mantissa value M.

8. The image sensor of claim 1, wherein the ADC circuit has a full scale voltage range, and wherein the voltage ramp overlaps with only a subset of the full scale voltage range.

9. The image sensor of claim 1, wherein the ADC circuit comprises a comparator having an offset, and wherein the voltage ramp is over-ranged to account for the offset of the comparator.

10. The image sensor of claim 1, wherein the voltage ramp has a fixed step size that is independent of the voltage level of the signal received from the image pixel.

11. The image sensor of claim 1, wherein the ADC circuit is a shot-noise-matched data converter.

12. A method of operating an image sensor having an image pixel and an analog-to-digital converter (ADC), the method comprising:
using the image pixel to output a pixel signal;
receiving the pixel signal at the ADC;
with the ADC, progressively attenuating the pixel signal to obtain a floating-point exponent value;
with the ADC, identifying the voltage level of the attenuated pixel signal by incrementally adjusting an analog ramp to obtain a floating-point mantissa value; and
computing a final output based on the floating-point exponent value and the floating-point mantissa value.

13. The method of claim 12, wherein ADC has an overall resolution, and wherein the analog ramp has a reduced resolution that is less than the overall resolution of the ADC.

14. The method of claim 12, wherein progressively attenuating the pixel signal comprises repeatedly dividing the pixel signal by a predetermined factor that is equal to or greater than two.

15. The method of claim 12, wherein obtaining the floating-point exponent value takes a first amount of time, and wherein obtaining the floating-point mantissa value takes a second amount of time that is greater than the first amount of time.

16. The method of claim 12, further comprising:
   identifying a reset voltage level by incrementally adjusting the analog ramp; and
   performing correlated double sampling based on the identified reset voltage level and the identified pixel signal level to remove column fixed-pattern noise.

17. An analog-to-digital converter (ADC) circuit having a total resolution, comprising:
   a comparator;
   a plurality of capacitors coupled to the comparator;
   a first set of switches coupled to the plurality of capacitors; and
   a second set of switches coupled to the plurality of capacitors, wherein the comparator has a input configured to receive an analog ramp having a resolution that is less than the total resolution of the ADC circuit, wherein the ADC circuit is further configured to receive a pixel signal, and wherein the first and second sets of switches are toggled in an alternating fashion to progressively attenuate the received pixel signal.

18. The analog-to-digital converter circuit of claim 17, wherein the progressive attenuation scheme of the ADC circuit is a passive capacitive charge sharing division scheme.

19. The analog-to-digital converter circuit of claim 17, wherein the ADC circuit has a non-flat quantization noise level that is shot-noise-matched, and wherein the analog ramp is capacitively coupled to the input of the comparator to provide a non-sampled ramp architecture.

\* \* \* \* \*